United States Patent [19]
Hayashi et al.

[11] Patent Number: 5,290,367
[45] Date of Patent: Mar. 1, 1994

[54] PHOTOELECTRIC ELEMENT

[75] Inventors: Yutaka Hayashi; Hidetaka Takato, both of Tsukuba, Japan

[73] Assignees: Agency of Industrial Science and Technology; Ministry of International Trade and Industry, Tokyo, Japan

[21] Appl. No.: 940,395

[22] Filed: Sep. 3, 1992

[30] Foreign Application Priority Data

Oct. 1, 1991 [JP] Japan .................. 3-280832

[51] Int. Cl.⁵ ............................. H01L 31/06
[52] U.S. Cl. .......................... 136/255; 257/461
[58] Field of Search .................. 136/255; 257/461

[56] References Cited

U.S. PATENT DOCUMENTS

| 3,928,073 | 12/1975 | Besson et al. | 136/256 |
| 5,215,599 | 6/1993 | Hingorani et al. | 136/255 |

FOREIGN PATENT DOCUMENTS

| 57-103371 | 6/1982 | Japan . | |
| 61-206270 | 9/1986 | Japan | 136/255 |

OTHER PUBLICATIONS

Doped Surfaces in One Sun, Point-Contactsolar Cells R. R. King, et al. Appl. Phys. Lett., vol. 54, No. 15, Apr. 1989, pp. 1460-1462.

Primary Examiner—Aaron Weisstuch
Attorney, Agent, or Firm—Oblon, Spivak, McClelland, Maier & Neustadt

[57] ABSTRACT

A photoelectric element includes a first region having a light-receiving surface. A second region having a short side length not greater than twice the minority carrier diffusion length of the first region is provided on at least one portion of the first region to form a photovoltaic mechanism in conjunction with the first region. A barrier layer is provided to cover at least those portions of the light-receiving surface of the first region not covered by the second region, and a transparent conductive film is provided on the barrier layer and electrically connected to at least one second region. The voltage of the second region generated by incident light is applied through the transparent conductive film to the light-receiving surface of the first region to produce an electric field in the direction inducing majority carriers.

8 Claims, 5 Drawing Sheets

PHOTOELECTRIC ELEMENT

BACKGROUND OF THE INVENTION

1. Field of the Invention

This invention relates to a photoelectric element.

2. Description of the Prior Art

Improvement of the performance characteristics of photoelectric elements has been approached from various angles. Of particular note regarding techniques for enhancing the conversion efficiency of such an element by increasing its open-circuit voltage are those disclosed in Japanese Patent Laid Open No. 57-103371 and *Appl. Phys. Lett.*, Vol. 54, No. 15, 1989, pp. 1460-1462.

The former of these teaches improvement of the open-circuit voltage and the fill factor of a $SnO_2/Si$ heterojunction solar cell by a technique related to a method for depositing the $SnO_2$.

The latter aims at achieving an efficiency improvement by forming junctions referred to as point contacts on the major surface of the substrate opposite the light-receiving surface (i.e. the rear surface). What this amounts to structurally is forming point-like P+ regions for junction formation at a prescribed pitch on the rear surface of a high-resistance n-type substrate and connecting the P+ regions of each row thereof by forming a plurality of stripe-like positive electrodes on the rear surface of the substrate. Moreover, stripe-like negative electrodes are formed interdigitedly adjacent to the stripe-like positive electrodes and good ohmic contacts are established between the negative electrodes and the high-resistance n-type substrate through point-like $n_+$ contact regions formed at a prescribed pitch also on the rear surface of the substrate.

The method disclosed in the aforesaid Laid-Open Patent document focuses on improving the efficiency of the heterojunction itself and, as such, does not take the shape and layout on the light-receiving side of the element into consideration as factors in enhancing the open-circuit voltage and conversion efficiency.

On the other hand, while the teaching of the *Appl. Phys. Lett.* article aims at a structural improvement, the element structure that it proposes involves problems that derive from the fact that the positive and negative electrodes are present only on the rear surface of the substrate and that the two types of electrodes are formed alternately by connecting the members of each type with a plurality of stripes. For example, there is a high risk of shorting owing to thick solder joints, the adherence of electrically conductive foreign matter, and other such causes. The structure also has a drawback from the materials aspect. Specifically, since the current collection junctions are formed only on the rear surface of the substrate opposite from the light-receiving surface, the efficiency decreases, not increases, unless a material is used in which the carrier diffusion length is sufficiently greater than the substrate thickness.

OBJECTS AND SUMMARY OF THE INVENTION

The present invention was completed in light of the foregoing circumstances and has as one of its objects to provide a photoelectric element that enables a marked improvement in photoelectric conversion to be achieved through an increase in open-circuit voltage, without entailing the risk of shorting between the positive and negative electrodes.

Another object of the invention is to provide a photoelectric element able to achieve a practical level of conversion efficiency even when it is constituted using a material exhibiting a short carrier diffusion length.

For achieving the foregoing objects, the present invention provides a photoelectric element comprising a first region of a semiconductor of a first conductivity type having front and rear major surfaces, one of which constitutes a light-receiving surface; at least one second region provided on at least one portion of the light-receiving side of the first region to form a photovoltaic mechanism in conjunction with the first region and having a shorter side in plan view, whose length is not more than twice the minority carrier diffusion length of the first region; a barrier layer covering at least those areas of the light-receiving surface of the first region at which the second region is not provided; and a transparent conductive film in electrical contact with the at least one second region and also in contact with the barrier layer for enabling a voltage generated by light incident on the light-receiving surface to be used for applying to the light-receiving surface under the barrier layer a bias voltage in the direction inducing carriers that are majority carries with respect to the semiconductor constituting the first region; a first electrode being provided on the transparent conductive film and a second electrode being provided on the major surface of the first region on the side opposite from the light-receiving surface thereof.

The danger of shorting is thus eliminated in the photoelectric element according to the invention by the provision of the positive and negative electrodes on opposite major surfaces of the first region. In addition, since the length of the shorter side of the second region is not greater than the minority carrier diffusion length of the first region and the voltage generated is applied through the transparent electrode to the light-receiving surface of the first region as a bias voltage so as to apply an electric field in the direction causing induction of majority carriers, the open-circuit voltage is increased and the photoelectric conversion efficiency improved. The invention therefore provides a practical photoelectric element capable of achieving improved photoelectric conversion efficiency even when applied to a material whose carrier diffusion length is too short for use in the prior art photoelectric elements.

These and other objects and features of the invention will be more apparent from the following description made with reference to the drawings.

DESCRIPTION OF THE PREFERRED EMBODIMENTS

Figure 1A:
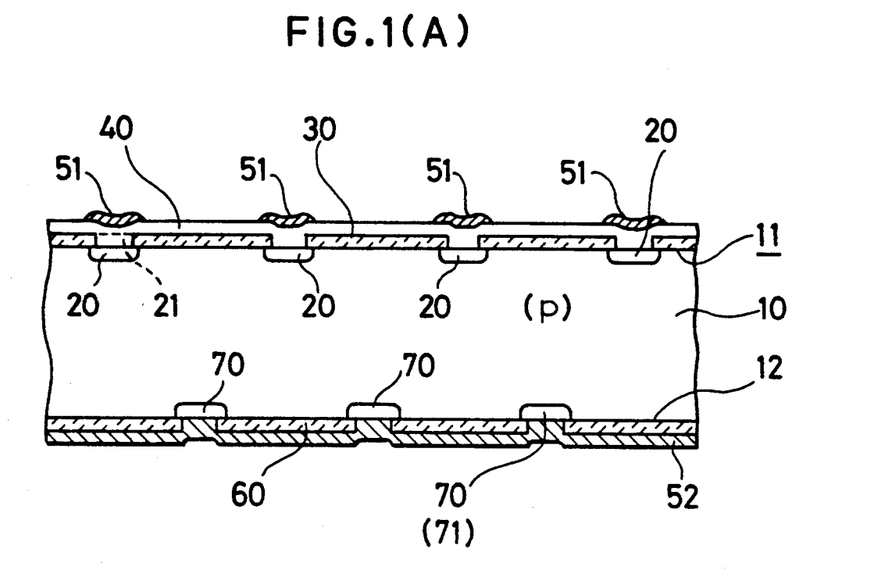
FIG. 1(A) is a schematic cross sectional view of an embodiment of the photoelectric element according to the invention.
Figure 1B:
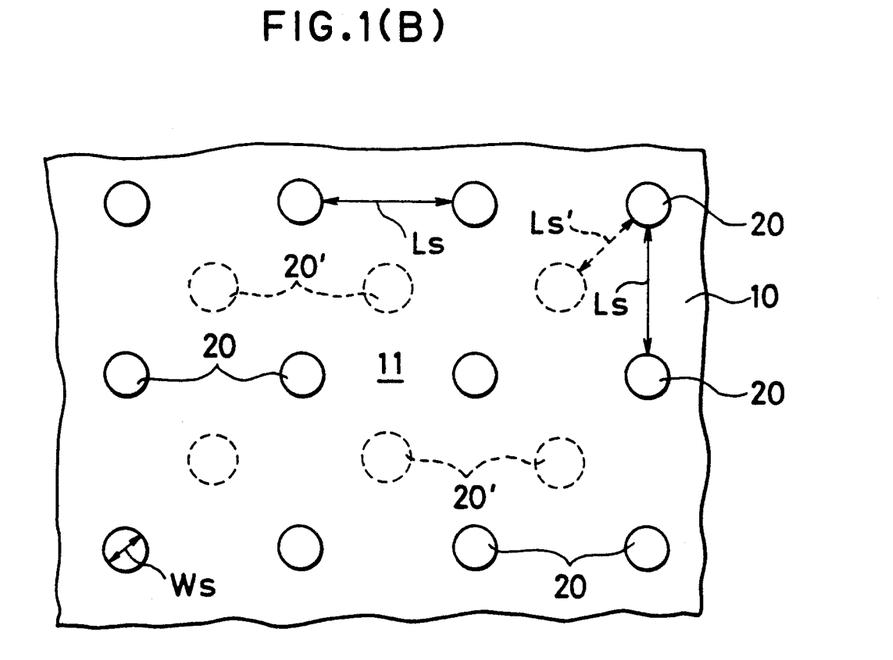
FIG. 1(B) is a schematic plan view of the element of FIG. 1.
Figure 2A:
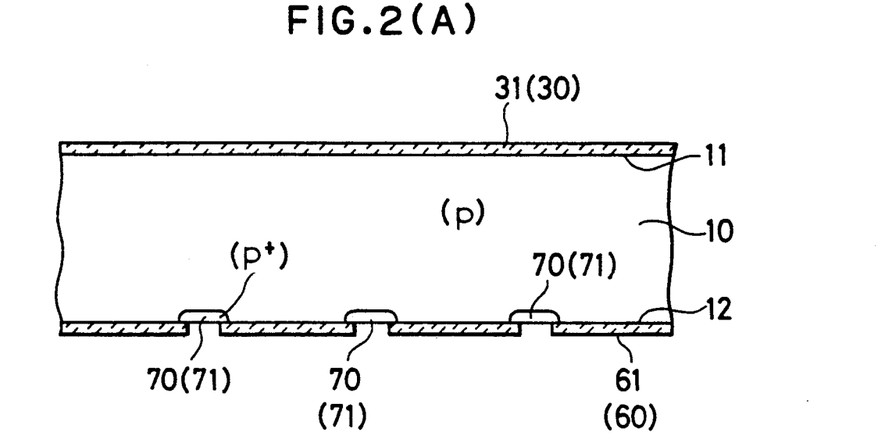
FIG. 2(A) is an explanatory view showing a stage in the fabrication of the element of FIG. 1(A), specifically the manner in which masking layers and high-concentration impurity regions are formed with respect to the first region.
Figure 2B:
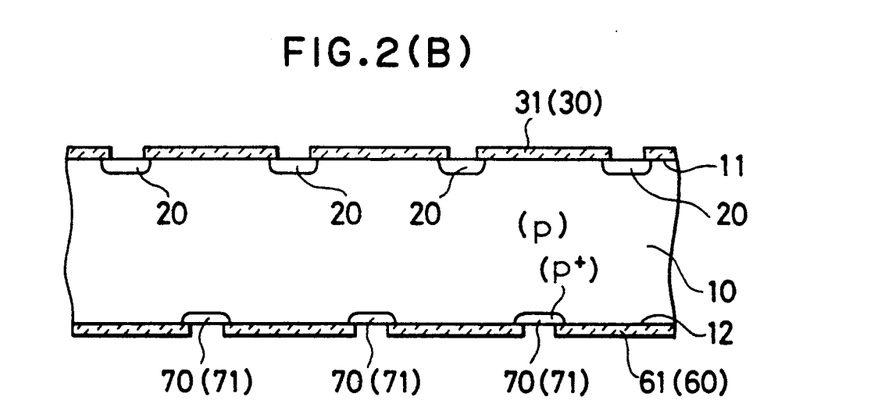
FIG. 2(B) is a view for explaining the formation of the second region in the first region in the stage following that shown in FIG. 2(A).
Figure 2C:
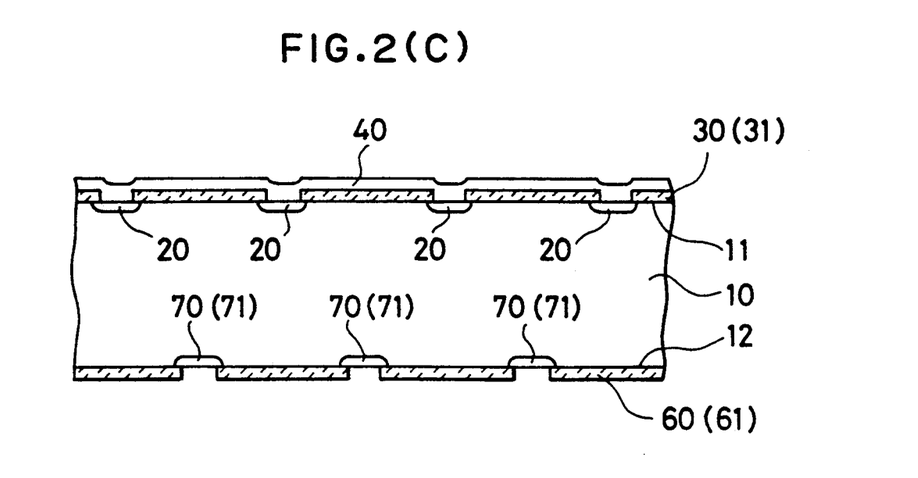
FIG. 2(C) is a view for explaining the formation of the transparent conductive film on the second region and a barrier layer in the stage following that shown in FIG. 2(B).

FIG. 1 shows a preferred embodiment of the photoelectric element according to the invention and FIG. 2 shows the fabrication steps of the same.

As shown in FIG. 2(A) the main structural element in the photoelectric element according to the invention is a first region 10 formed of a semiconductor having a conductivity type (i.e. not intrinsic). This may, for example, be obtained from an ordinary silicon wafer, a III-V group semiconductor wafer, or a sheet or film of either of these materials. While it may be of either conductivity type, it is of p-type in the embodiment under discussion. Either the front or rear major surface of the first region 10 serves as the light-receiving surface of the completed element. In the drawings, the major surface at the top is designated as the light-receiving surface 11 and the major surface on the opposite side as the opposite surface 12.

A masking layer 31 is formed on the light-receiving surface 11 and a masking layer 61 is formed on the opposite surface 12. As will be explained later, these masking layers can also serve as barrier layers 30, 60, and to indicate this, the reference numerals 30 and 60 are shown in parentheses following the reference numerals 31 and 61 in FIG. 2(A). The fabrication stage shown in FIG. 2(A) also includes the formation in the masking layer 61 formed on the opposite surface 12 of a prescribed number of openings of prescribed shape arranged in a prescribed pattern and the selective formation via the openings of high-concentration impurity regions 70 of the same conductivity type as the first region 10. The high-concentration impurity regions 70 are formed by an appropriate known method such as thermal diffusion, ion implantation, plasma doping, chemical vapor deposition, epitaxial growth or the like and are provided for improving the photoelectric conversion efficiency of the element by repelling minority carriers and for establishing good ohmic contact with a second electrode 52 formed later. The high-concentration impurity regions 70 can be formed either by introducing an impurity into the first region in the manner just described or by lamination onto the opposite surface 12.

Next, as shown in FIG. 2(B), a prescribed number of openings of prescribed shape arranged in a prescribed pattern are formed in the masking layer 31 formed on the light-receiving surface 11 and the second region 20 capable of forming a rectifying junction with the first region 10 is formed via the openings by an appropriate known method such as thermal diffusion, ion implantation, plasma doping, chemical vapor deposition, epitaxial growth or the like. In the case where the first region 10 is a p-type semiconductor as in the foregoing, an ordinary n-type semiconductor is appropriate for use as the second region 20. Alternatively, the second region 20 can be formed as a laminated structure comprised of a plurality of layers. For example, it can be a laminated structure consisting of i layers and n layers. Prior art technologies can be used for the fabrication of the laminated structure. In some circumstances, the surface portion forming the second region 20 on the first region 10 can be a laminated structure.

Irrespective of the formation method used, it suffices for the second region 20 to constitute a known photovoltaic mechanism in conjunction with the first region. The material thereof is selected in consideration of the conductivity type of the first region 10 from among silicides enabling hole injection, metals enabling electron injection, and the like.

Next, in the case where the masking layers 31, 61 used in the step of FIG. 2(B) are unable to double as barrier layers, they are removed. Then, as shown in FIG. 2(C), a barrier layer 30 is formed on the light-receiving surface 11 and a barrier layer 60 is formed on the opposite surface 12, whereafter contact openings are formed in the barrier layer 30 on the light-receiving side for exposing the second region 20 and a transparent conductive film 40 is formed to be coextensive with the whole area of the light-receiving surface of the first region 10. In addition, on the opposite surface 12, the masking layer 61 used in the step of FIG. 2(B) and removed in case it is incapable of serving as a barrier layer 60 is replaced by a freshly formed barrier layer 60 which is then formed with contact openings for exposing the surfaces of the high-concentration impurity regions 70 formed earlier.

The completed photoelectric element according to the first embodiment shown in FIG. 1 is then obtained by forming a first electrode 51 on the transparent conductive film 40 and the second electrode 52 on the barrier layer 60. The first electrode 51 is formed on the transparent conductive film 40 in a narrow stripe pattern or the like so as to minimize interference with incoming light, while the second electrode 52 can be formed to be coextensive with the entire opposite surface 12. In addition, when the transparent conductive film 40 and the second region 20 are not in ohmic contact (ohmic contact thereof not being indispensable), the first electrode 51 can be formed in direct contact with the second region 20. To establish ohmic contact between the transparent conductive film 40 and the second region 20, a third conductive region 21 can be formed in between the second region 20 and the transparent conductive film 40.

In the photoelectric converter of this arrangement, when light falling incident on the light-receiving surface 11 produces a voltage in the second region 20 by the known photovoltaic principle, the fact that the transparent conductive film 40 is in electrical contact with both the second region 20 and the upper surface of the barrier layer 30 causes a voltage bias to be applied to the area of the light-receiving surface 11 positioned under the barrier layer 30. Since the polarity of the bias voltage is in the direction causing induction at the surface of the light-receiving surface 11 of what are majority carriers for the first region 10, formation of an inversion layer is suppressed. This surface condition is hereinafter referred to as "electrically accumulated".

As a result, this self-biasing effect increases the conversion efficiency and the open-circuit voltage. Tests conducted by the inventors show that, relative to a photoelectric element without this type of self-biasing structure, the increase in the open-circuit voltage $V_{OC}$ amounts to $$(nkT/q) \cdot \ln\{(A_1+A_2)/A_2\}$$

where $A_1$ is the total effective light-receiving area constituted by the part of the major surface on the light-receiving side of the first region not covered by the second region, $A_2$ is the total light-receiving area of the second region, k is Boltzmann's constant, T is absolute temperature, q is electronic charge, n is the n value (ideality factor) in the voltage-current equation for the diode characteristics when $A_1=0$.

However, for obtaining the aforesaid effect, it is necessary for at least the short side length of the second region 20 as seen in plan view to be not greater than twice the minority carrier diffusion length of the first region 10.

The term "short side length" used for convenience here requires further definition as it applies to cases in which the shape of the second region is other than that of a rectangle having longer and shorter sides. Where the shape is circular it is defined as the diameter of the circle and, for arbitrary shapes is more generally defined as the value obtained by erecting inwardly directed perpendicular line pairs on the periphery of the plan-view shape of the second region and averaging the lengths of those perpendicular pairs which intersect at equal distances from the periphery and whose points of intersection describe the longest locus among all line pairs intersecting at equal distances from the periphery. This will be explained again later with respect to the drawings.

Moreover, where the second region 20 consists of a plurality of subregions, for preventing loss of the open-circuit voltage increase effect it is necessary that, as shown in FIG. 1(B), the distance $L_S$ between the proximal points on the periphery of adjacent subregions of the second region 20 be not greater than $$(2LnkT/q) \cdot \ln\{(A_1+A_2)/A_2\}/V_o$$

where L is the minority carrier diffusion length of the semiconductor constituting the first region, and $V_o$ is the open-circuit voltage when $A_1=0$.

In the example shown in FIG. 1(B), the second region 20 is constituted as a group of mutually independent subregions that are circular in plan view and located at the intersections of a rectangular lattice pattern. It is further possible to provide a second region subregion 20' at the center of each lattice mesh. In this case, the shortest distance between adjacent subregions becomes that indicated by the symbol $L_{S'}$ in FIG. 1(B).

In addition, the second region 20 used in the present invention can have a continuous plan-view pattern such that a plurality of parts thereof can be counted within at least one section perpendicular to the major surface. An example of such an arrangement is shown in FIG. 5(A).

Figure 5A:
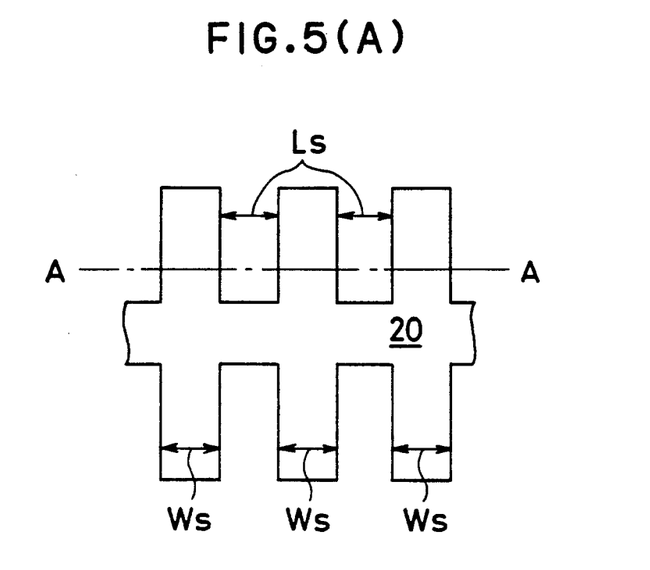
FIG. 5(A) is an explanatory view showing an example of the shape of the second region of the photoelectric element according to the invention as seen in plan view.

More specifically, it suffices for the second region 20 to have a plan view shape such that a plurality of parts thereof can be counted within a prescribed section taken such as indicated by the line A—A in FIG. 5(A). In this case, it is possible to define the length $W_S$ of the short side of the plurality of individual parts and the distance $L_S$ between adjacent parts.

Moreover, if the plan-view shape of the individual subregions when the second region is constituted of a plurality of subregions is rectangular or if the general plan-view shape at the parts where the plurality of parts is counted is rectangular, the short side length $W_S$ is simply that, or, in the case of a square, is the length of one side. In the case of a circle, it is the circle diameter. (The length $W_S$ of one circular subregion of the second region 20 is indicated in FIG. 1(B).). It is also possible to define the short side length more generally so as to apply to all types of plan-view patterns.

Figure 5B:
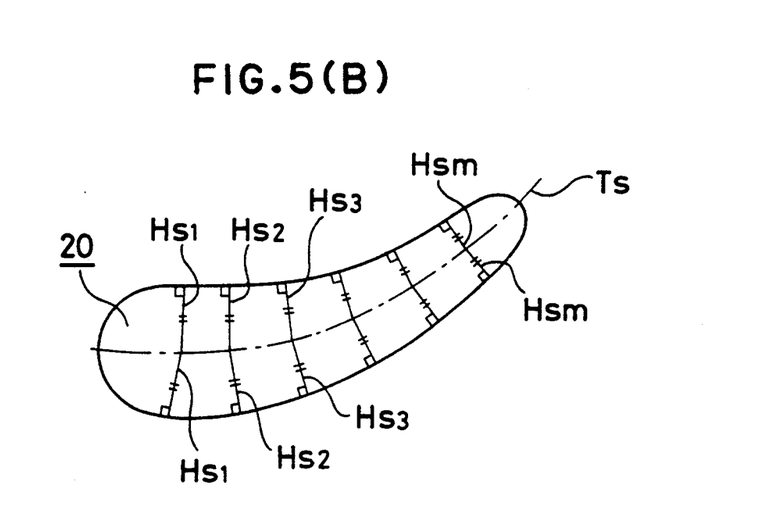
FIG. 5(B) is an explanatory view of another example of the shape of the second region as seen in plan view.

Consider, for example, the arbitrary pattern of the second region 20 shown in FIG. 5(B). Short side length $W_S$ can be defined as the value obtained by erecting inwardly directed perpendicular line pairs on the periphery of the plan-view shape of the second region and averaging the lengths of those perpendicular pairs ($H_{S1}$, $H_{S1}$), ($H_{S2}$, $H_{S2}$), . . . ($H_{Sm}$, $H_{Sm}$) which intersect at equal distances from the periphery and whose points of intersection describe the longest locus $T_S$, among all line pairs intersecting at equal distances from the periphery. On the condition of taking a large enough sampling number m, therefore, the short side length can be obtained as $$W_S = 2(H_{S1} + H_{S2} + \ldots + H_{Sm})/m.$$

This explanation with respect to FIG. 5 also applies to the second embodiment of the invention to be described later with respect to FIG. 4.

If at the time the photoelectric element is exposed to light a large amount of current should flow from the transparent conductive film side to the first region via the barrier layer 30 (i.e. if the barrier layer 30 has low resistance), it will not be possible to obtain the self-biasing effect. While in view of the principle involved, the barrier layer 30 should preferably be an insulator, as a practical matter it suffices for it to be a high-resistance layer or a wide-gap semiconductor layer able to form an adequately large potential barrier with respect to the first region 10 or the transparent conductive film 40, and, from the structural viewpoint, this is more convenient. In other words, it is possible to use as the barrier layer 30 in the present invention any material layer which passes no more than a negligible amount of current relative to the photoelectric current density produced by the incident light.

Figure 3A:
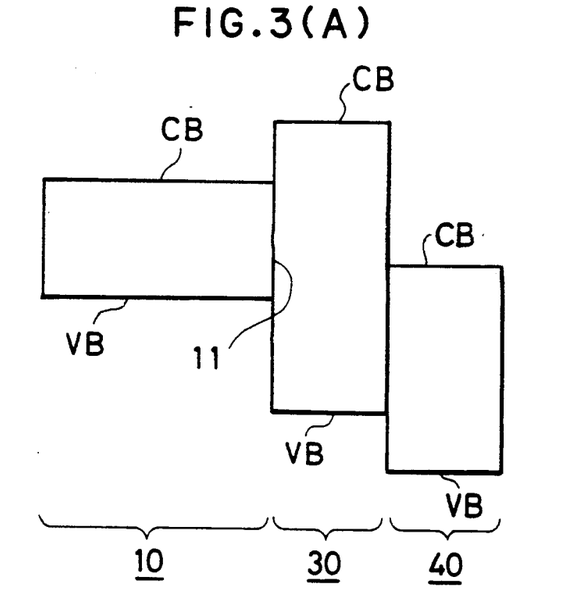
FIG. 3(A) is an explanatory view showing an example of an energy band diagram of the photoelectric element according to the invention.
Figure 3B:
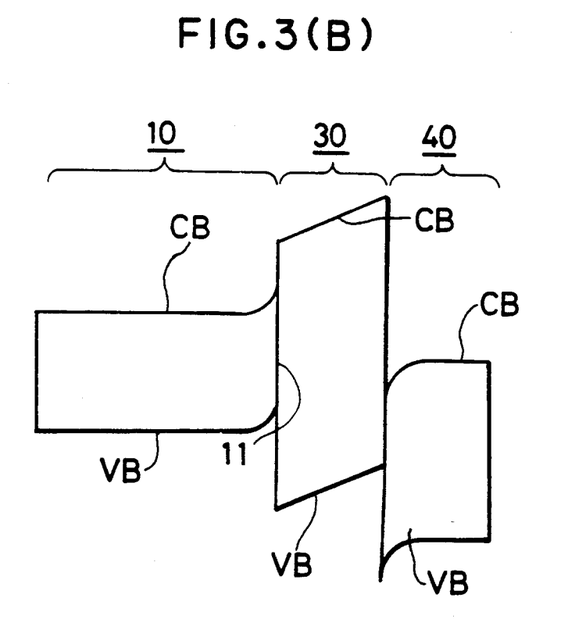
FIG. 3(B) is an explanatory view showing the energy band diagram when the photoelectric element is exposed to light.

FIG. 3 shows an example, not intended to be limitative, of the band profile in the case where a wide-gap semiconductor is used for the barrier layer 30 and a p-type semiconductor is used for the first region 10. In this figure, the conduction bands of the individual regions are indicated by the reference symbol CB and the valence bands by the symbol VB. When light impinges on the first region 10, producing a potential in the transparent conductive film 40 through the second region 20, the state shown in FIG. 3(A) at the time of no light input changes to that shown in FIG. 3(B). Specifically, the bias effect acting through the large potential barrier produced by the presence of the barrier layer 30 causes band bending so that holes, which are majority carriers, are induced in the light-receiving surface 11 of the first region 10.

Figure 4A:
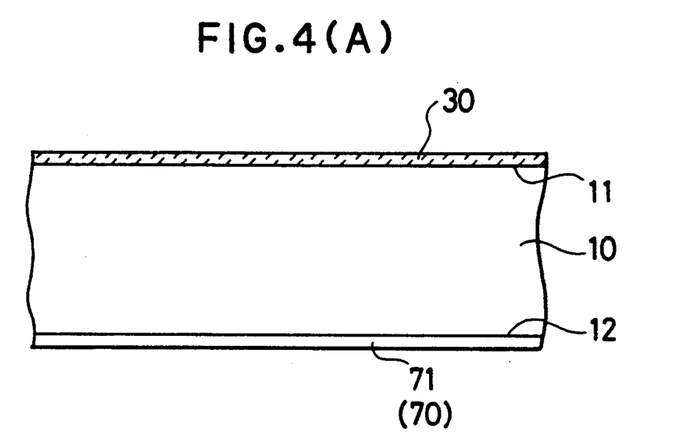
FIG. 4(A) is an explanatory view showing the photoelectric element according to the invention formed on the first region with the barrier layer and a heterojunction forming region.
Figure 4B:
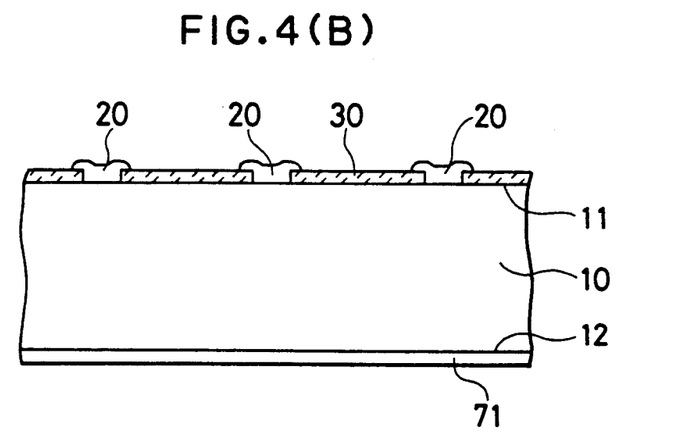
FIG. 4(B) is an explanatory view showing the first region further formed with the second region.
Figure 4C:
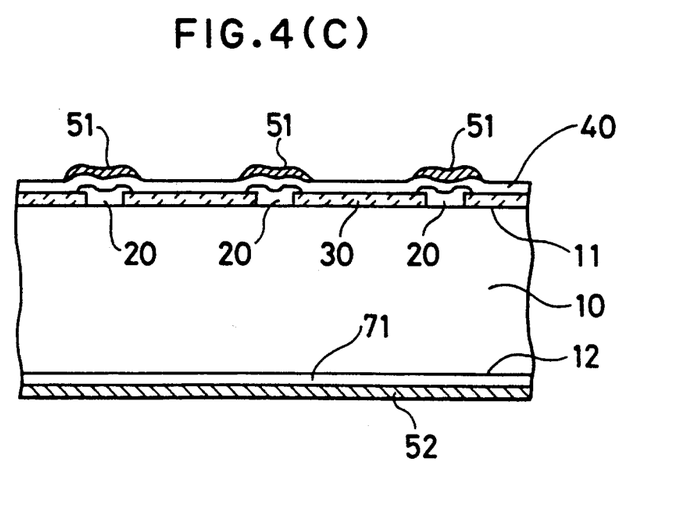
FIG. 4(C) is an explanatory view showing the element completed by the formation of the transparent conductive film, the first electrode, and the second electrode.

FIG. 4 shows the structure of another photoelectric element according to the invention, along with an example of the steps for fabricating the same.

First, as shown in FIG. 4(A), a barrier layer 30 is at this stage formed directly on the light-receiving surface 11 of a first region 10, which may be of p-type semiconductor, and a heterojunction forming region 71, for example, is formed on the opposite surface 12.

Next, as shown in FIG. 4(B), openings of a prescribed shape are formed in the barrier layer 30 in a prescribed pattern and, in entirely the same manner as that explained regarding the earlier embodiment, a second region 20 of a material able to form a photovoltaic mechanism in conjunction with the first region 10 is formed by filling the openings.

Then, as shown in FIG. 4(C) a transparent conductive film 40 is formed continuously over the second region 20 and the barrier layer 30, a first electrode 51 is formed on the transparent conductive film 40, and at the opposite surface 12 a second electrode 52 is formed on the heterojunction forming region 71. This completes the element.

The conditions required by the invention which were explained earlier with respect to the first embodiment also have to be met by this second embodiment. Specifically, the short side length of the second region 20 as seen in plan view has to be not more than twice the minority carrier diffusion length of the first region 10, and when the second region 20 is constituted of a plurality of discrete subregions as shown in FIG. 4 or is constituted such that a plurality of parts thereof can be counted at least within one section taken perpendicular to the major surfaces, the distance between adjacent subregions or parts has to be not greater than $$(2LnkT/q)\cdot \ln\{(A_1+A_2)/A_2\}/V_o$$

times the minority carrier diffusion length L. Insofar as the embodiment having the structure shown in FIG. 4 satisfies these conditions, it is able to manifest the effect of the invention as regards increased open-circuit voltage and enhanced conversion efficiency in the same way as the first embodiment.

In the embodiment of FIG. 4, instead of being formed with the high-concentration impurity regions 70 of the first embodiment the opposite surface 12 is formed over the whole thereof with the region 71 capable of forming a heterojunction with the first region 10. Like the high-concentration impurity regions 70, the heterojunction forming region 71 also serves to repel minority carriers and, as such, contributes to improvement of the conversion efficiency. The heterojunction forming region 71 does not, however, have to be provided over the entire area of the opposite surface 12. Provision over only a part thereof suffices Therefore, as indicated by reference numeral 71 in parentheses in FIGS. 1 and 2, the high-concentration impurity regions 70 of the first embodiment can also be replaced by heterojunction forming regions 71. Conversely, as indicated by the reference numeral 70 in parentheses in FIG. 4, the heterojunction forming region 71 of the second embodiment can be replaced by a high-concentration impurity region 70 fully or partially covering the opposite surface 12.

Similarly to what was discussed earlier with regard to the first region 10, and again without intention of limiting the invention, it can be pointed out that in either of the foregoing embodiments, where the first region 10 is constituted of silicon, the material of the barrier layers 30 and 60 can be selected from among silicon oxide, silicon nitride, SIPOS, gallium phosphide and the like, and where it is constituted of a III-V group semiconductor, and particularly where it is constituted of gallium arsenide, the material thereof can be gallium aluminum arsenide or the like.

As regards the heterojunction forming region 71, on the other hand, free selection of combinations from among a fairly broad range of known prior-art materials is possible. For example, when the first region 10 is constituted of p-type silicon, the material of the region 71 can be selected from among p-type hydrogenated amorphous silicon, hydrogenated microcrystalline silicon, amorphous silicon carbide, p-type gallium phosphide and the like.

As regards the second region 20, while the invention does not directly specify the material or physical properties of this region, in cases where the first region 10 is constituted of p-type silicon, it can, as was mentioned earlier, be selected from among n-type and i-type hydrogenated amorphous silicon.

While the transparent conductive film 40 is not itself encompassed by the principle of the invention, it is noted that the material thereof can be selected from among indium tin oxide, tin oxide, zinc oxide and the like. Although the material of the first region 10 has to be taken into consideration in selecting the material of the transparent conductive film 40, depending on the properties of the first region 10 it is in some cases possible for the transparent conductive film 40 also to provide the function of the second region 20. That is to say, a part of the transparent conductive film 40 can constitute the second region 20.

When the transparent conductive film 40 and the second region 20 are formed separately, it is possible to electrically contact the film and the region through an additionally provided separate third region 21 (in the manner indicated by the phantom line at the left side of FIG. 1(A), for example) insofar as good electrical contact can be maintained therebetween.

It is preferable for the transparent conductive film 40 to be of the so-called textured type so as to enable it to prevent reflection.

It is also preferable to enhance the passivation of the surface portions of the light-receiving side of the first region 10 which are not covered by the second region 20 by addition to a level not exceeding the degeneracy concentration of impurity atoms of the same conductivity type as that of the first region, because this produces an effect which, working synergistically with the fundamental effect of the invention, enhances the short wavelength sensitivity of the photoelectric element and thus further increases its overall conversion efficiency.

According to the invention, the provision of the second region so as to meet the condition that its short side length be not greater than twice the minority carrier diffusion length of the first region enables improvement of the open circuit voltage of the element. By applying the voltage produced in the second region through the transparent conductive film to the light-receiving surface of the first region as a bias voltage, the light-receiving surface can be electrically accumulated and stabilized by self-biasing, without need for any outside voltage source. As a result, the photoelectric element enjoys an improvement in terms of both open-circuit voltage, conversion efficiency, and stability.

We claim:

1. A photoelectric element comprising:
   a first region of a semiconductor of a first conductivity type having front and rear major surfaces, one of which constitutes a light-receiving surface;
   at least one second region provided on at least one portion of the light-receiving side of the first region to form a photovoltaic mechanism in conjunction with the first region, said second region having a shorter side, in plan view, whose length is not more than twice the minority carrier diffusion length of the first region;
   a barrier layer covering at least those portions of the light-receiving surface of the first region at which the second region is not provided; and
   a transparent conductive film in electrical contact with the at least one second region and also in contact with the barrier layer, for enabling a voltage generated by light incident on the light-receiving surface to be applied to the light-receiving surface under the barrier layer as a bias voltage of a polarity inducing majority carriers of the semiconductor constituting the first region.

2. A photoelectric element according to claim 1, wherein:
   the second region is constituted as a plurality of separate subregions or as a continuous region having a plurality of spaced apart parts;
   the distance between peripheries of adjacent ones of the plurality of subregions or between adjacent parts being not greater than $$(2LnkT/q) \cdot \ln\{(A_1+A_2)/A_2\}V_0$$

where
   L is the minority carrier diffusion length of the semiconductor constituting the first region,
   $A_1$ is the total effective light-receiving area constituted by the portion of the major surface of the light-receiving side of the first region that is not covered by the second region,
   $A_2$ is the total light-receiving area of the second region,
   $V_0$ is the open-circuit voltage when $A_1=0$;
   n is the n value in the voltage-current equation for the diode characteristics when $A_1=0$
   k is Boltzmann's constant,
   T is absolute temperature, and
   q is electronic charge.

3. A photoelectric element according to claim 1, wherein a part of the transparent conductive film constitutes the second region.

4. A photoelectric element according to claim 1, further provided with a third region disposed between and electrically connecting the transparent conductive film and the second region.

5. A photoelectric element according to claim 1, further comprising a first electrode electrically connected with the transparent conductive film, a second electrode provided over the major surface of the first region on the side that is opposite from the light-receiving surface thereof, and a high-concentration impurity region provided on the opposite major surface, for electrically connecting the second electrode with the opposite major surface.

6. A photoelectric element according to claim 5, further comprising a second barrier layer disposed between the opposite major surface of the first region and the second electrode, said second barrier layer being disposed at portions other than those where the high-concentration impurity region and the second electrode are in contact.

7. A photoelectric element according to claim 1, further comprising a first electrode electrically connected with the transparent conductive film, a second electrode provided over the major surface of the first region on the side that is opposite from the light-receiving surface thereof, and a heterojunction forming region for repelling minority carriers provided between the second electrode and the first region.

8. A photoelectric element according to claim 1, wherein the portions of the major surface on the light-receiving side of the first region that are not covered by the second region contain impurity atoms of the same conductivity type as that of the first region and in a concentration that does not exceed the degeneracy concentration.

* * * * *